US008106666B2

(12) United States Patent
Ahmed et al.

(10) Patent No.: US 8,106,666 B2
(45) Date of Patent: Jan. 31, 2012

(54) TESTING AN ELECTRICAL COMPONENT

(75) Inventors: Rubina F. Ahmed, Cary, NC (US);
Moises Cases, Austin, TX (US);
Bradley D. Herrman, Cary, NC (US);
Bhyrav M. Mutnury, Austin, TX (US);
Pravin Patel, Cary, NC (US); Peter R. Seidel, Cary, NC (US)

(73) Assignee: International Business Macines Corporation, Armonk, NY (US)

( * ) Notice: Subject to any disclaimer, the term of this patent is extended or adjusted under 35 U.S.C. 154(b) by 401 days.

(21) Appl. No.: 12/402,806

(22) Filed: Mar. 12, 2009

(65) Prior Publication Data
US 2010/0231209 A1 Sep. 16, 2010

(51) Int. Cl.
*G01R 31/02* (2006.01)
(52) U.S. Cl. .......................... 324/537; 324/228; 324/691
(58) Field of Classification Search .................. None
See application file for complete search history.

(56) References Cited

U.S. PATENT DOCUMENTS

| 3,992,663 | A | * | 11/1976 | Seddick ........................ 324/529 |
| 5,631,572 | A | | 5/1997 | Sheen et al. |
| 6,242,923 | B1 | | 6/2001 | Scaman et al. |
| 6,459,272 | B1 | | 10/2002 | Yamashita |
| 6,639,144 | B1 | | 10/2003 | Toh |
| 6,937,035 | B2 | * | 8/2005 | Kawaike et al. ......... 324/754.29 |
| 7,250,781 | B2 | | 7/2007 | Nakagawa et al. |

OTHER PUBLICATIONS

IBM TDB n2 07-90 p. 255—Fatigue Test for Conductors in Interconnection Structures.

* cited by examiner

*Primary Examiner* — Minh N Tang
(74) *Attorney, Agent, or Firm* — H. Barrett Spraggins; Cynthia G. Seal; Biggers & Ohanian, LLP.

(57) ABSTRACT

Testing an electrical component, the component including a printed circuit board ('PCB') with a number of traces, the traces organized in pairs with each trace of a pair carrying current in opposite directions and separated from one another by a substrate layer of the PCB, where testing of the electrical component includes: dynamically and iteratively until a present impedance for a pair of traces of the component is greater than a predetermined threshold impedance: increasing, by an impedance varying device at the behest of a testing device, magnetic field strength of a magnetic field applied to the pair of traces by the impedance varying device, including increasing the present impedance of the pair of traces; measuring, by the testing device, one or more operating parameters; and recording, by the testing device, the measurements of the operating parameters.

20 Claims, 3 Drawing Sheets

TESTING AN ELECTRICAL COMPONENT

BACKGROUND OF THE INVENTION

1. Field of the Invention

The field of the invention is data processing, or, more specifically, methods, apparatus, and products for testing an electrical component.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago. Computer systems today are often capable of including one or more modular components, components which may be removed and replaced with ease. Such components are typically formed with a printed circuit board ('PCB') with many traces etched on the PBC. The manufacturer of such a PCB typically manufactures the PCB, according to some manufacturing tolerances, such as trace width tolerances, tolerances for the material composition of the traces and PCB substrate, tolerances for the position and angles of the etched traces, and other manufacturing tolerances, any of which may affect electrical characteristics of the trace, the PCB, electrical components soldered to the traces, and a computer system in which such a component is installed. Because two electrical components may be manufactured within such manufacturing tolerances, the electrical operating characteristics of two electrical components of the same type may actually vary. Such variations may introduce a small or large amount of variation of electrical characteristics in a larger electrical system in which the component is installed. In fact, in a multi-component system, with each component manufactured within manufacturing tolerances, such variations may compound, causing a large deviation from expected system operation. Current techniques for testing electrical components, however, often do not test for variation within these manufacturing tolerances. Specifically, variation in impedance between traces of PCBs of same-type components, is often ignored. In fact, the only current way to test an electrical component taking into account possible variations in manufacturing tolerances, is to test a batch of different PCBs of the same-type of component. Such a test, however, does not guarantee that the entire range of manufacturing tolerances is taken into account, but instead typically represents only a small number tolerance variations.

SUMMARY OF THE INVENTION

Methods, apparatus, products, and impedance varying devices for testing an electrical component are disclosed where the component includes a printed circuit board ('PCB') with a plurality of traces, the traces are organized in pairs with each trace of a pair carrying current in opposite directions and separated from one another by a substrate layer of the PCB. In embodiments of the present invention testing the electrical component includes dynamically and iteratively until a present impedance for a pair of traces of the component is greater than a predetermined threshold impedance: increasing, by an impedance varying device at the behest of a testing device, magnetic field strength of a magnetic field applied to the pair of traces by the impedance varying device, including increasing the present impedance of the pair of traces; measuring, by the testing device, one or more operating parameters; and recording, by the testing device, the measurements of the operating parameters.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
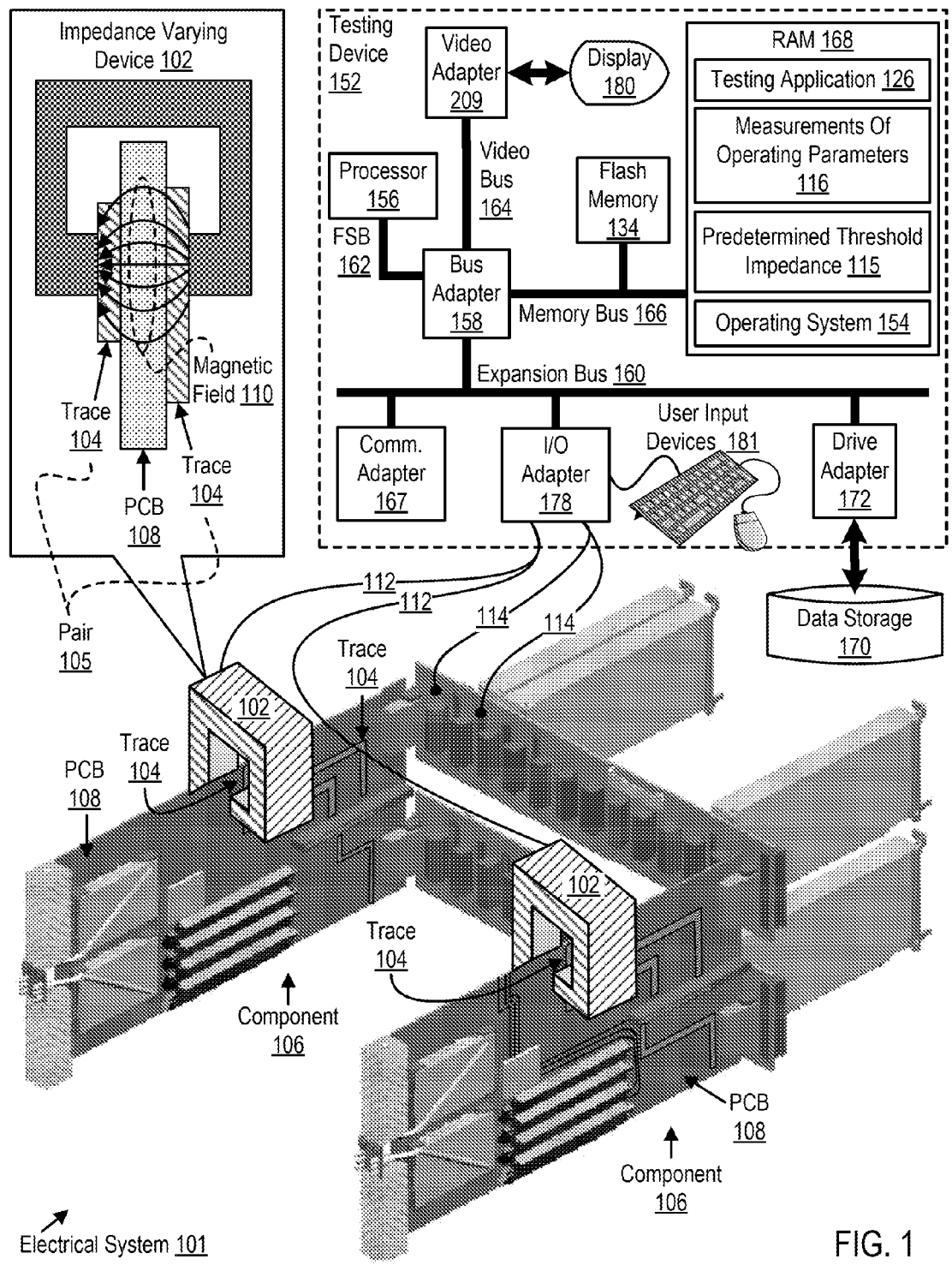
FIG. 1 sets forth a block diagram of testing environment that includes an electrical system in which one or more electrical component is installed and for which testing of the components is carried out in accordance with embodiments of the present invention.

Exemplary methods, apparatus, devices, and products for testing an electrical component in accordance with the present invention are described with reference to the accompanying drawings, beginning with FIG. 1. FIG. 1 sets forth a block diagram of testing environment that includes an electrical system (101) in which one or more electrical component is installed and for which testing of the components is carried out in accordance with embodiments of the present invention.

An electrical system as the term is used in this specification is any system having one or more components or subcomponents powered by electricity. Examples of such an electrical system include personal computers, laptops, personal digital assistants ('PDAs'), mobile cellular phones, so-called smart phones, servers, server racks, blade servers, and so on as will occur to readers of skill in the art.

Testing, from time to time in this specification, may be described as system-level testing. The term 'system-level' as used in this specification describes testing procedures in which one or more operating parameters of a configured, operational electrical system are measured, where that electrical system includes some number of installed and operational components. 'Operating parameters' as the term is used in this specification refer to measurable electrical operating characteristics such as, for example, frequency, voltage, current, resistance, capacitance, impedance, power, and the like. 'System-level' testing of such parameters may be further explained in contrast to component-level testing in which parameters of a component are measured when that component is not installed in an operational electrical system but rather is isolated from the electrical system. Operating characteristics of an isolated, uninstalled component, however, may vary when that component is installed in an electrical system. As such, system-level testing provides actual measurements of parameters of an installed, operational component which would otherwise be unattainable or at best, only estimated values.

Readers of skill in the art will immediately recognize that testing an electrical component according to embodiments of the present invention may include either or both system-level testing and component-level testing. That is, testing a particular component according to embodiments of the present invention may include 'component-level testing,' measuring operating parameters of the particular component when the particular component is isolated from a system, and 'system-level testing,' measuring operating parameters of a system while the particular component is installed in the system, regardless of whether the measured operating parameters are operating parameters of the particular component or operating parameters of another system component.

As mentioned above, one example implementation of an electrical system (101) for which system-level testing may be carried out in accordance with embodiments of the present invention is a server, more specifically, a blade server. A server, as the term is used in this specification, refers generally to a multi-user computer that provides a service (e.g. database access, file transfer, remote access) or resources (e.g. file space) over a network connection. The term 'server,' as context requires, refers inclusively to the server's computer hardware as well as any server application software or operating system software running on the server. A server application is an application program that accepts connections in order to service requests from users by sending back responses. A server application can run on the same computer as the client application using it, or a server application can accept connections through a computer network. Examples of server applications include file server, database server, backup server, print server, mail server, web server, FTP servers, application servers, VPN servers, DHCP servers, DNS servers, WINS servers, logon servers, security servers, domain controllers, backup domain controllers, proxy servers, firewalls, and so on.

Blade servers are self-contained servers, designed for high density. As a practical matter, all computers are implemented with electrical components requiring power that produces heat. Components such as processors, memory, hard drives, power supplies, storage and network connections, keyboards, video components, a mouse, and so on, merely support the basic computing function, yet they all add bulk, heat, complexity, and moving parts that are more prone to failure than solid-state components. In the blade paradigm, most of these functions are removed from the blade computer, being either provided by the blade server chassis (DC power) virtualized (iSCSI storage, remote console over IP), or discarded entirely (serial ports). The blade itself becomes simpler, smaller, and amenable to dense installation with many blade servers in a single blade server chassis.

The example electrical system (101) of FIG. 1 is an example of an electrical system implemented as a blade server. FIG. 1 depicts the electrical system (101) implemented as blade server with only a small number of components installed for clarity, not limitation. FIG. 1 also does not depict an enclosure or chassis for the blade server components or a server rack in which the blade server is installed for clarity, not limitation. Readers of skill in the art will immediately recognize that electrical systems (101) implemented as blade servers for which testing of an electrical component is carried out according to embodiments of the present invention may be installed in server racks, be enclosed in a server chassis, include many more components, and may otherwise be implemented in a different form and configuration than the blade server electrical system (101) of FIG. 1. Each such form and configuration is well within the scope of the present invention.

The example electrical system (101) of FIG. 1 includes one or more electrical components (106). In the example electrical system (101) of FIG. 1, each electrical component includes a printed circuit board ('PCB') with a plurality of traces. An electrical component is any module powered by electricity that may be installed in an electrical system and comprises a PCB with one or more pairs (105) of traces. Examples of components installed in an electrical system (101) for which system-level testing is carried out in accordance with embodiments of the present invention include a Dual In-line Memory Module ('DIMM'), an input/output ('I/O') cards, a graphics card, a network adapter, a daughter card, a Solid-State Drive ('SSD'), and so on as will occur to readers of skill in the art.

A printed circuit board, or PCB, is used to mechanically support and electrically connect electronic components using conductive pathways, or traces, etched from copper sheets laminated onto a non-conductive substrate. A PCB is sometimes also referred to as a printed wiring board ('PWB'), etched wiring board, a printed circuit assembly ('PCA'), or printed circuit board assembly ('PCBA'). PCBs are typically rugged, inexpensive, and highly reliable.

In the example of FIG. 1, the traces (104) are organized in pairs (105) with each trace (104) of a pair (105) carrying current in opposite directions and separated from one another by a substrate layer of the PCB (108). A pair (105) of traces may carry current in 'opposite directions,' for example, when one trace is implemented as a signal transmission line and the other trace in the pair (105) is implemented as a current return path for the signal transmission line. Readers of skill in the art will immediately recognize that current traveling in 'opposite directions' according to embodiments of the present invention need not follow identical, parallel or superimposed paths. Current traveling along a current return path of a signal transmission line, for example, need not follow a path identical to that traveled by the current of the signal transmission line in order to be traveling in an 'opposite direction' in accordance to embodiments of the present invention. Instead, the current traveling along the current return path need only travel generally in a direction opposite that of the current traveling along the signal transmission line.

The example electrical system (101) of FIG. 1 is configured with two impedance varying devices operation of which is administered by a testing device (152). An impedance varying device (102) is a device used in system-level testing of an electrical system (101) in accordance with embodiments of the present invention that applies a magnetic field (110) to a pair (105) of traces (104). At the behest of the testing device (152), the strength of the magnetic field is varied. When the strength of the magnetic field applied to a pair (105) of traces is varied, the impedance of the pair (105) of traces is also varied. The magnetic field, when applied to a pair of traces carrying current in opposite directions, skews charge distribution in the pair of traces in opposite directions, such that an increase in the magnetic field strength further skews charge distribution, and a decrease in magnetic field strength decreases skewing of charge distribution in the pair of traces. The skew in charge distribution in the pair of traces results in varying in impedance of the pair of the traces. That is, when the strength of the magnetic field applied to a pair of traces is increased, the effective impedance of the traces is also increased. When the strength of magnetic field applied to a pair of traces is decreased, the effective impedance of the traces is also decreased. An impedance varying device (102)

is used for system-level testing of an electrical system (101) according to embodiments of the present invention, at the behest of the testing device (152), dynamically and iteratively until a present impedance for a pair of traces (104) of a component (106) is greater than a predetermined threshold impedance (115), by increasing magnetic field strength of a magnetic field (110) applied to the pair of traces (104). As mentioned above, increasing the magnetic field strength of the magnetic field (110) applied to the pair of traces (104) also increases the present impedance of the pair of traces.

The testing device (152) in the example of FIG. 1 is automated computing machinery, a computer, which includes at least one computer processor (156) or 'CPU' as well as random access memory (168) ('RAM') which is connected through a high speed memory bus (166) and bus adapter (158) to processor (156) and to other components of the testing device (152). Stored in RAM (168) of the testing device (152) is a testing application (126), a module of computer program instructions that causes the testing device (152) to carry out testing of an electrical component (106) in accordance with embodiments of the present invention, dynamically and iteratively until a present impedance for a pair (105) of traces (104) of the component (106) is greater than a predetermined threshold impedance (115), by: operating the impedance varying device (102) to increase magnetic field strength of a magnetic field (110) applied to the pair (105) of traces (104) by the impedance varying device (102) thereby increasing the present impedance of the pair of traces; measuring one or more operating parameters; and recording the measurements (116) of the operating parameters. The testing device may operate the impedance varying device through an out of band bus (112) connecting the impedance varying device (102) to the testing device (152). Such an out-of-band bus (112) may be implemented in many ways, including for example, as a Low Pin Count ('LPC') bus, an Inter-Integrated Circuit ('I2C') bus, a System Management Bus ('SMBus'), a Serial Peripheral Interface ('SPI') Bus, a Universal Serial Bus ('USB'), and so on as will occur to those of skill in the art.

The testing device may measure one or more operating parameters by measuring electrical characteristics, such as voltage, current, resistance, impedance, power, capacitance, inductance, signal frequency, and so on, with one or more test probes (114) that connect the electrical system (101) with the I/O adapter (178) of the testing device (152). The testing device (152) may then record the measurements (116) of the operating parameters by storing data representing the value of the measurements in a data structure, such as a table, list, array and so on, in association with the present impedance of the pair of traces at the time of the measurement, and a parameter identifier that identifies the operating parameter measured.

Also stored in RAM (168) of the testing device (152) is an operating system (154). Operating systems useful for testing electrical components according to embodiments of the present invention include UNIX™, Linux™, Microsoft XP™, AIX™, IBM's i5/OS™, and others as will occur to those of skill in the art. The operating system (154), testing application (126), predetermined threshold impedance (115), and measurements of operating parameters (116) in the example of FIG. 1 are shown in RAM (168), but many components of such software typically are stored in non-volatile memory also, such as, for example, on a disk drive (170).

The testing device (152) of FIG. 1 includes disk drive adapter (172) coupled through expansion bus (160) and bus adapter (158) to processor (156) and other components of the testing device (152). Disk drive adapter (172) connects non-volatile data storage to the testing device (152) in the form of disk drive (170). Disk drive adapters useful in testing devices configured to test electrical components according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory such as 'EEPROM' or 'Flash' memory (134), RAM drives, and so on, as will occur to those of skill in the art.

The example testing device (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example testing device (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary testing device (152) of FIG. 1 includes a communications adapter (167) for data communications with other computers (not shown in FIG. 1) and for data communications with a data communications network (not shown in FIG. 1). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for testing electrical components according to embodiments of the present invention include modems for wired dial-up communications, Ethernet (IEEE 802.3) adapters for wired data communications network communications, and 802.11 adapters for wireless data communications network communications.

The arrangement of the testing device (152), impedance varying device (102), electrical system (101), and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
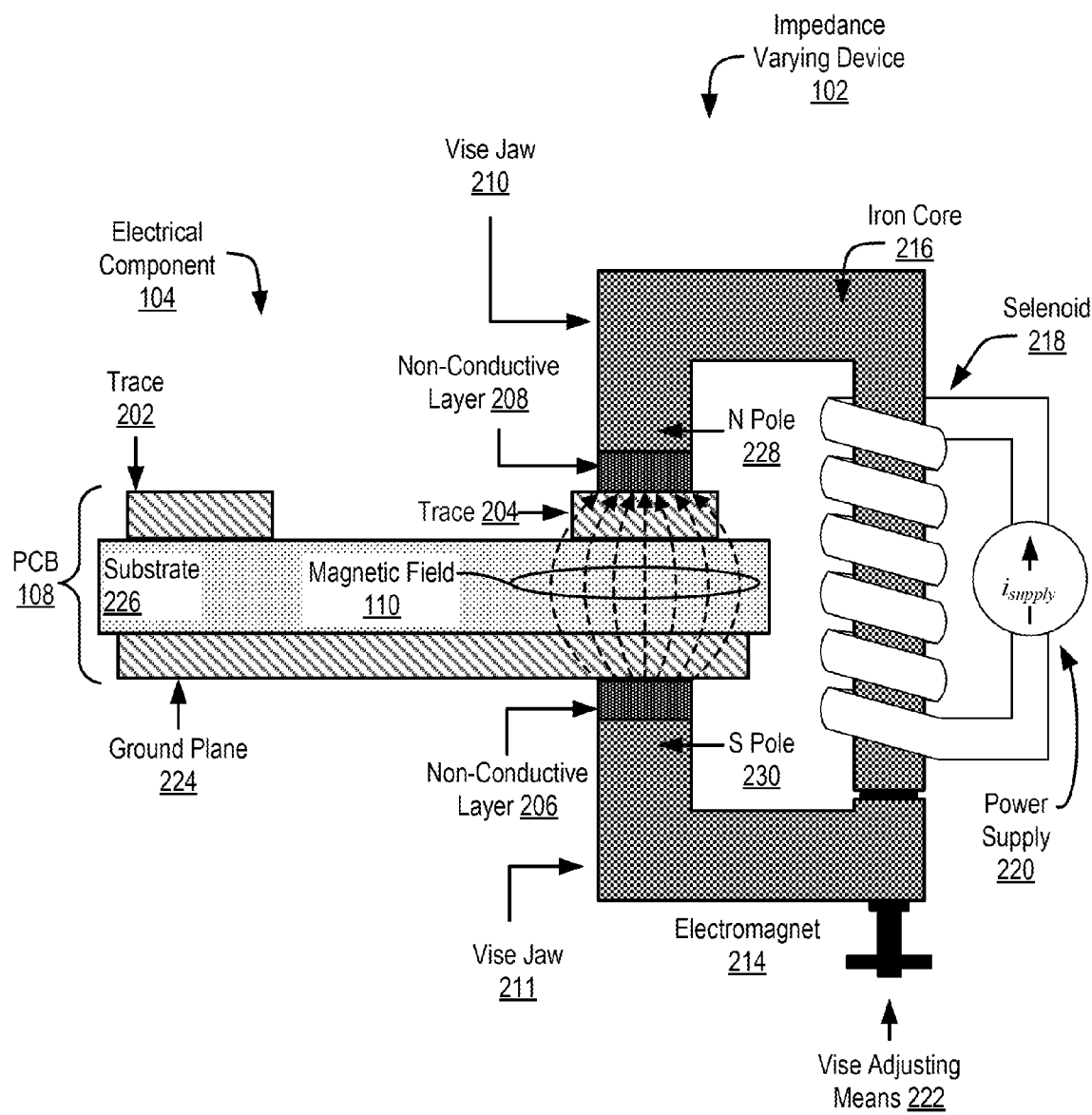
FIG. 2 sets forth a perspective view of an impedance varying device used in testing an electrical component according to embodiments of the present invention.

For further explanation, FIG. 2 sets forth a perspective view of an impedance varying device (102) used in testing an electrical component according to embodiments of the present invention. The example impedance varying device (102) of FIG. 2 is configured to increase, at the behest of a testing device (152 on FIG. 1), dynamically and iteratively until a present impedance for a pair of traces (204, 224) of the component (104) is greater than a predetermined threshold impedance, magnetic field strength of a magnetic field (110)

applied to the pair of traces (204, 224) by the impedance varying device. By increasing the magnetic field (110) applied to the pair of traces, the impedance varying device (102) also increases the present impedance of the pair of traces (204, 224).

The impedance varying device (102) in the example of FIG. 2 is implemented as electromagnet (214) with an iron core (216) and a solenoid (218) coiled around the iron core (216) and conducting electrical current (isupply), the electrical current supplied to the solenoid by a power supply (220). The electromagnet, the example implementation of the impedance varying device (102) depicted in the example of FIG. 2, is configured as an adjustable vise having two jaws (210, 211). A vise generally is an instrument consisting of two jaws that may be closed by operating a vise adjusting means (222), such as a screw, lever, cam, or the like. The jaws (210, 211) of the impedance varying device (102) of FIG. 2, for example, may be closed around a PCB, on a pair of traces, by turning the vise adjusting means (222). In the example of FIG. 2, one jaw (210) includes a magnetic north pole (228) of the electromagnetic and the other jaw (211) includes a magnetic south pole (230) of the electromagnetic. The jaw (210) that includes the magnetic north pole (228) is positioned above a first trace (204) of the pair of traces on one side of the substrate (226) of the PCB (108) and the jaw (211) that includes the magnetic south pole (230) is positioned above the second trace (224) of the pair of traces on an opposite side of the PCB (108). In the example of FIG. 1, the trace (224) is implemented as a ground plane that operates as a reference voltage for electrical components soldered to traces of the PCB (108) and carries return current for signal transmission traces, such as trace (202) and trace (204) for example. Also in the example of FIG. 2, each jaw (210, 211) of the vise includes a non-conductive layer (208, 206) that affixes the vise non-conductively to the PCB (108).

The impedance varying device (102) may increase the magnetic field strength of a magnetic field by receiving, an increased an amount of current supplied to the solenoid by the power supply (220). Such current supply ($i_{supply}$) may be increased by the testing device (152 of FIG. 1) through an out-of-band bus similar to the out-of-band bus (112) depicted in the example of FIG. 1. Such an out-of-band bus, may, in fact be configured to carry such current supply directly from a power source implemented as part the testing device (102). Alternatively, the power supply (220) may be module separate and apart from the testing device, but connected to the testing device and controlled by the testing device through the out-of-band bus. That is, the testing device may be connected to the impedance varying device indirectly, through a power supply (220), not directly as shown in FIG. 1.

Figure 3:
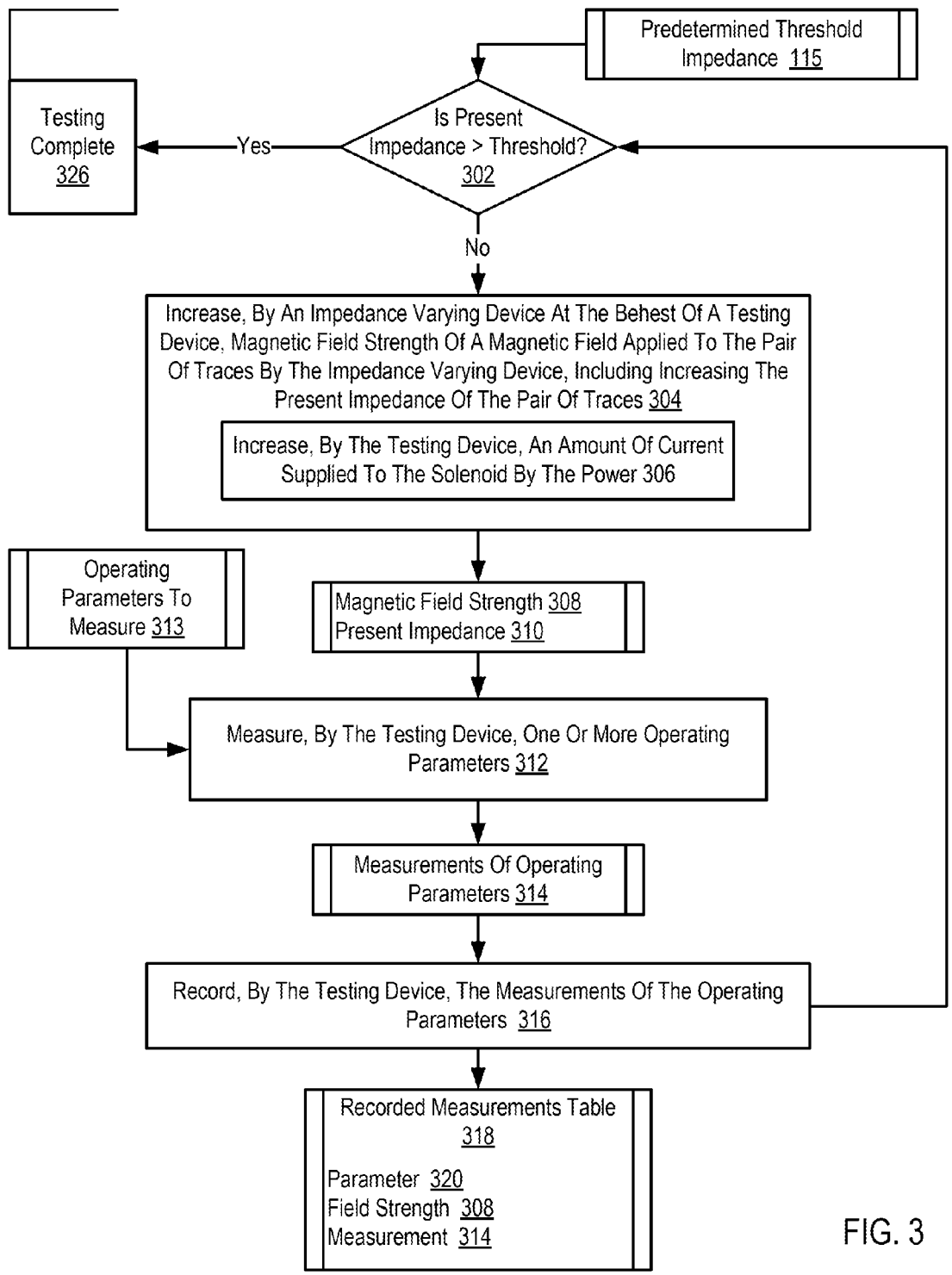
FIG. 3 sets forth a flow chart illustrating an exemplary method for testing an electrical component according to embodiments of the present invention.

For further explanation, FIG. 3 sets forth a flow chart illustrating an exemplary method for testing an electrical component according to embodiments of the present invention. Such an electrical component for which testing is carried out according to embodiments of the present invention is similar to the electrical components depicted in the example of FIG. 1 in which the component (106 on FIG. 1) include a printed circuit board ('PCB') (108 on FIG. 1) with a plurality of traces (104 on FIG. 1) with the traces (104 on FIG. 1) organized in pairs and each trace of a pair carrying current in opposite directions and separated from one another by a substrate layer of the PCB (108).

The method of FIG. 3 is carried out dynamically and iteratively until a present impedance (310) for a pair of traces of the component is greater than a predetermined threshold impedance (115). Dynamically and iteratively carrying out the method of FIG. 2 until a present impedance (310) for a pair of traces of the component is greater than a predetermined threshold impedance (115) includes determining (326), upon each iteration, whether the present impedance (310) of the pair of traces is greater than the predetermined threshold impedance (115). If the present impedance (310) of the pair of traces is greater than the predetermined threshold impedance (115), the testing of the component is complete (326). If the present impedance (310) of the pair of traces is not greater than the predetermined threshold impedance (115), the method of FIG. 2 continues on to the next iteration which includes increasing (304), by an impedance varying device (102 on FIG. 1) at the behest of a testing device (152 on FIG. 1), magnetic field strength (308)of a magnetic field (110 on FIG. 1) applied to the pair of traces by the impedance varying device, including increasing the present impedance (310) of the pair of traces; measuring (312), by the testing device (152 on FIG. 1), one or more operating parameters (313); and recording (316), by the testing device (152 on FIG. 1), the measurements (324) of the operating parameters.

The method of FIG. 3 is said to be carried out 'dynamically' in that the method of FIG. 3 is carried out automatically, without human interaction. That is, the testing device (152 on FIG. 1) is automated computing machinery that sets a magnetic field strength of the magnetic field applied to a pair of traces of a PCB by an impedance varying device (102 of FIG. 1), measures parameters, records the measurements, increases the magnetic field strength, measures parameters, records the measurements, again increases the magnetic field strength, and so on until measurements are recorded for a range of impedance values of the pair of traces, effectively a range of magnetic field strengths—all of which is carried out by the testing apparatus automatically, without human interaction.

Like the example impedance varying device (102) of FIG. 2, the impedance varying device used in testing an electrical component in accordance with the method of FIG. 3 may be implemented as an electromagnet having an iron core and a solenoid coiled around the iron core and conducting electrical current with the electrical current supplied to the solenoid by a power supply.

In such an embodiment, increasing (304) magnetic field strength (308) of a magnetic field (110 on FIG. 1) applied to the pair of traces by the impedance varying device may be carried out by increasing (306), by the testing device, an amount of current supplied to the solenoid by the power supply. The magnetic field strength (308) and present impedance (310) of the pair of traces, therefore, may be represented in data as values of current, rather than values expressed in units of magnetic field strength or impedance. In fact, in some implementations only the magnetic field strength (308) and present impedance (310) may be represented in data by one single value, the present amount of current supply to the solenoid of the electromagnet.

Recording (318) the measurements (314) of the operating parameters (313) may be carried out by storing each measurement (314) in a data structure, such as the example 'Recorded Measurements Table' (318) of FIG. 3, in association with an identification of the parameter measured, such as a parameter identifier (320), and the present magnetic field strength (308) or the impedance of the pair of traces (310) at the time of the measurement. As mentioned above, the present magnetic field strength (308) and present impedance (310) may be represent by the present amount of current supplied to the solenoid of an impedance varying device implemented as an electromagnet.

Exemplary embodiments of the present invention are described largely in the context of a fully functional computer system for testing an electrical system at system-level. Readers of skill in the art will recognize, however, that the present invention also may be embodied in a computer program product disposed on signal bearing media for use with any suitable data processing system. Such signal bearing media may be transmission media or recordable media for machine-readable information, including magnetic media, optical media, or other suitable media. Examples of recordable media include magnetic disks in hard drives or diskettes, compact disks for optical drives, magnetic tape, and others as will occur to those of skill in the art. Examples of transmission media include telephone networks for voice communications and digital data communications networks such as, for example, Ethernets™ and networks that communicate with the Internet Protocol and the World Wide Web as well as wireless transmission media such as, for example, networks implemented according to the IEEE 802.11 family of specifications. Persons skilled in the art will immediately recognize that any computer system having suitable programming means will be capable of executing the steps of the method of the invention as embodied in a program product. Persons skilled in the art will recognize immediately that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of testing an electrical component, the component comprising a printed circuit board ('PCB') with a plurality of traces, the traces organized in pairs with each trace of a pair carrying current in opposite directions and separated from one another by a substrate layer of the PCB, the method comprising:
    dynamically and iteratively until a present impedance for a pair of traces of the component is greater than a predetermined threshold impedance;
    increasing, by an impedance varying device at the behest of a testing device, magnetic field strength of a magnetic field applied to the pair of traces by the impedance varying device, including increasing the present impedance of the pair of traces;
    measuring, by the testing device, one or more operating parameters; and
    recording, by the testing device, the measurements of the operating parameters.

2. The method of claim 1 wherein the impedance varying device further comprises an electromagnet, the electromagnet comprising:
    an iron core; and
    a solenoid coiled around the iron core and conducting electrical current, the electrical current supplied to the solenoid by a power supply.

3. The method of claim 2 wherein increasing, at the behest of a testing device, magnetic field strength of a magnetic field further comprises:
    increasing, by the testing device, an amount of current supplied to the solenoid by the power supply.

4. The method of claim 2 wherein the electromagnet comprises an adjustable vise, the adjustable vise comprising two jaws, one jaw comprising a magnetic north pole of the electromagnetic, another jaw comprising a magnetic south pole of the electromagnetic, the jaw comprising the magnetic north pole positioned above a first trace of the pair of traces on one side of the PCB, the jaw comprising the magnetic south pole positioned above the second trace of the pair of traces on an opposite side of the PCB, each jaw of the vise further comprising a non-conductive layer that affixes the vise non-conductively to the PCB.

5. The method of claim 1 wherein the electrical component is installed in an electrical system, the electrical system comprising a blade server.

6. An apparatus for testing an electrical component, the component comprising a printed circuit board ('PCB') with a plurality of traces, the traces organized in pairs with each trace of a pair carrying current in opposite directions and separated from one another by a substrate layer of the PCB, the apparatus comprising:
    a computer processor; and
    a computer memory operatively coupled to the computer processor, wherein the computer memory comprises computer program instructions that when executed cause the apparatus to carry out the steps of:
    dynamically and iteratively until a present impedance for a pair of traces of the component is greater than a predetermined threshold impedance;
    increasing, by an impedance varying device at the behest of a testing device, magnetic field strength of a magnetic field applied to the pair of traces by the impedance varying device, including increasing the present impedance of the pair of traces;
    measuring, by the testing device, one or more operating parameters; and
    recording, by the testing device, the measurements of the operating parameters.

7. The apparatus of claim 6 wherein the impedance varying device further comprises an electromagnet, the electromagnet comprising:
    an iron core; and
    a solenoid coiled around the iron core and conducting electrical current, the electrical current supplied to the solenoid by a power supply.

8. The apparatus of claim 7 wherein increasing, at the behest of a testing device, magnetic field strength of a magnetic field further comprises:
    increasing, by the testing device, an amount of current supplied to the solenoid by the power supply.

9. The apparatus of claim 7 wherein the electromagnet comprises an adjustable vise, the adjustable vise comprising two jaws, one jaw comprising a magnetic north pole of the electromagnetic, another jaw comprising a magnetic south pole of the electromagnetic, the jaw comprising the magnetic north pole positioned above a first trace of the pair of traces on one side of the PCB and the jaw comprising the magnetic south pole positioned above the second trace of the pair of traces on an opposite side of the PCB, each jaw of the vise further comprising a non-conductive layer that affixes the vise non-conductively to the PCB.

10. The apparatus of claim 6 wherein the electrical component is installed in an electrical system, the electrical system comprising a blade server.

11. An impedance varying device for testing an electrical component, the component comprising a printed circuit board ('PCB') with a plurality of traces, the traces organized in pairs with each trace of a pair carrying current in opposite directions and separated from one another by a substrate layer of the PCB, the impedance varying device configured to:

dynamically and iteratively until a present impedance for a pair of traces of the component is greater than a predetermined threshold impedance;

increase, at the behest of a testing device, magnetic field strength of a magnetic field applied to the pair of traces by the impedance varying device, including increasing the present impedance of the pair of traces, wherein the testing device is configured to measure one or more system-level parameters and record the measurements of the system-level parameters.

12. The impedance varying device of claim 11 further comprising an electromagnet, the electromagnet comprising:

an iron core; and a solenoid coiled around the iron core and conducting electrical current, the electrical current supplied to the solenoid by a power supply.

13. The impedance varying device of claim 12 wherein the impedance varying device configured to increase magnetic field strength of a magnetic field at the behest of a testing device further comprises:

the testing device further configured to increase an amount of current supplied to the solenoid by the power supply.

14. The impedance varying device of claim 12 wherein the electromagnet comprises an adjustable vise, the adjustable vise comprising two jaws, one jaw comprising a magnetic north pole of the electromagnetic, another jaw comprising a magnetic south pole of the electromagnetic, the jaw comprising the magnetic north pole positioned above a first trace of the pair of traces on one side of the PCB and the jaw comprising the magnetic south pole positioned above the second trace of the pair of traces on an opposite side of the PCB, each jaw of the vise further comprising a non-conductive layer that affixes the vise non-conductively to the PCB.

15. The impedance varying device of claim 11 wherein the electrical component is installed in an electrical system, the electrical system comprising a blade server.

16. A computer program product for testing an electrical component, the component comprising a printed circuit board (PCB') with a plurality of traces, the traces organized in pairs with each trace of a pair carrying current in opposite directions and separated from one another by a substrate layer of the PCB, the computer program product disposed in a computer readable recording medium, the computer program product comprising computer program instructions that, when executed, cause a computer to carry out the steps of:

dynamically and iteratively until a present impedance for a pair of traces of the component is greater than a predetermined threshold impedance;

increasing, by an impedance varying device at the behest of a testing device, magnetic field strength of a magnetic field applied to the pair of traces by the impedance varying device, including increasing the present impedance of the pair of traces;

measuring, by the testing device, one or more system-level parameters; and recording, by the testing device, the measurements of the system-level parameters.

17. The computer program product of claim 16 wherein the impedance varying device further comprises an electromagnet, the electromagnet comprising:

an iron core; and a solenoid coiled around the iron core and conducting electrical current, the electrical current supplied to the solenoid by a power supply.

18. The computer program product of claim 17 wherein increasing, at the behest of a testing device, magnetic field strength of a magnetic field further comprises:

increase, by the testing device, an amount of current supplied to the solenoid by the power supply.

19. The computer program product of claim 17 wherein the electromagnet comprises an adjustable vise, the adjustable vise comprising two jaws, one jaw comprising a magnetic north pole of the electromagnetic, another jaw comprising a magnetic south pole of the electromagnetic, the jaw comprising the magnetic north pole positioned above a first trace of the pair of traces on one side of the PCB and the jaw comprising the magnetic south pole positioned above the second trace of the pair of traces on an opposite side of the PCB, each jaw of the vise further comprising a non-conductive layer that affixes the vise non-conductively to the PCB.

20. The computer program product of claim 16 wherein the electrical component is installed in an electrical system, the electrical system comprising a blade server.

* * * * *